(12) United States Patent  
Goncharenko (10) Patent No.: US 7,126,324 B1  
(45) Date of Patent: Oct. 24, 2006

(54) PRECISION DIGITAL PHASE METER

(75) Inventor: Anatoly M. Goncharenko, Novosibirsk (RU)

(73) Assignee: Innalabs Technologies, Inc., Dulles, VA (US)

( * ) Notice: Subject to any disclaimer, the term of this patent is extended or adjusted under 35 U.S.C. 154(b) by 1 day.

(21) Appl. No.: 11/284,921

(22) Filed: Nov. 23, 2005

(51) Int. Cl.
*G01R 25/00* (2006.01)
*G01R 23/12* (2006.01)

(52) U.S. Cl. .............................. 324/76.77; 324/76.52; 324/521; 702/72

(58) Field of Classification Search ............. 324/76.77, 324/76.52, 521; 702/72
See application file for complete search history.

(56) References Cited

U.S. PATENT DOCUMENTS 3,675,129 A * 7/1972 Melvin ....................... 375/330
4,608,553 A * 8/1986 Ormond ...................... 341/118
6,738,205 B1 * 5/2004 Moran et al. .................. 360/17
2003/0210165 A1 * 11/2003 Carreau et al. .............. 341/141
2005/0137871 A1 * 6/2005 Capman et al. .............. 704/268

OTHER PUBLICATIONS

A.M. Goncharenko, A High Speed Precision Digital Phase Meter with Direct Calculation of the Signal Phase, Instruments and Experimental Techniques, vol. 48, No. 2, 2005, pp. 215-218.

* cited by examiner

*Primary Examiner*—Anjan Deb
*Assistant Examiner*—Amy He
(74) *Attorney, Agent, or Firm*—Bardmesser Law Group (57) ABSTRACT

A method of measuring phase includes receiving an analog signal; converting the analog signal into a digital signal; representing the digital signal as N sets of samples; aligning the N sets of samples to a common time frame; removing zero bias drift from the digital signal; and calculating a phase of the analog signal based on the digital signal with the zero bias drift removed. The phase can have a time resolution substantially equal to a time between adjacent samples.

24 Claims, 4 Drawing Sheets

PRECISION DIGITAL PHASE METER

BACKGROUND OF THE INVENTION

1. Field of the Invention

The present invention relates to digital phase measurement, and, more particularly, to measurement of phase in signals with high dynamic range in both amplitude and phase, and with a high degree of modulation.

2. Background Art

Conventional phase meters have difficulty handling signals that have a high dynamic range in amplitude, and a high dynamic range in phase. Most phase meters work in the phase range between −π and +π, or, more commonly, in the range between $$-\frac{\pi}{2} \text{ and } +\frac{\pi}{2}.$$

For most conventional phase meters, a phase in the hundreds of π, or millions of π, presents an insurmountable problem.

Another problem afflicting conventional phase meters is the dynamic range of the amplitude of the signal. For example, many conventional phase meters can handle a signal between, e.g., 0.5 volts and 5 volts. However, a signal that ranges between a few microvolts and a few volts (in other words, ranges over 40 dB in amplitude) is very difficult for conventional phase meters to handle accurately. Yet another problem is the change in the sign of the input signal, which often triggers "glitches" in conventional phase meter output.

Accordingly, there is a need in the art for a way to accurately measure phase of an input signal that has a high dynamic range (on the order of 40–50 dB) in amplitude with a high degree of modulation (for example, on the order of 50%), as well as optionally a high resolution in phase (for example, on the order of $2\pi \cdot 10^{-5}$ radian) and with no phase range limitation.

BRIEF SUMMARY OF THE INVENTION

The present invention relates to precision measurement of phase in signals with high dynamic range in amplitude and phase that substantially obviates one or more of the disadvantages of the related art.

More particularly, in an exemplary embodiment of the present invention, a method of measuring phase includes receiving an analog signal; converting the analog signal into a digital signal with a sample rate approximately equal to a frequency of the input signal multiplied by N; representing the digital signal as N sets of samples; aligning the N sets of samples to a common time frame; removing zero bias drift from the digital signal; and calculating a phase of the analog signal based on the digital signal with the zero bias drift removed. The phase can have a time resolution substantially equal to a time between adjacent samples.

The N samples of the digital signal can be represented as a projection of a rotating vector onto the axes oriented at the angles 360°/N relative to each other, with $A(1,j)=U_{Nj}$, $A(2,j)=U_{Nj+1}$, $A(3,j)=U_{Nj+2}$, ... $A(N,j)=U_{Nj+N-1}$, $j \epsilon [0, 1, 2 \dots \infty]$, U being the analog signal; A being the projection of the rotating vector;

Time alignment procedure onto the projection A results in a projection B with values received at the same time $t_j+(2N-1)T_s/2$:

$B(1, j) = [A(1, j) + (2N-1)A(1, j+1)]/2N$, $B(2, j) = [3A(2, j) + (2N-3)A(2, j+1)]/2N$, $B(3, j) = [5A(3, j) + (2N-5)A(3, j+1)]/2N$,

...

$B(N, j) = [(2N-1)A(N, j) + A(N, j+1)]/2N$, $\epsilon_j = [B(1,j)+B(2,j)+ \dots +B(N,j)]/N$ is the zero bias drift;

Zero bias drift remove procedure of the signals B results in a projection C with values received at the same time and the zero bias drift ADC removed.

$C(1, j) = B(1, j) - \epsilon_j$, $C(2, j) = B(2, j) - \epsilon_j$,

...

$C(N, j) = B(N, j) - \epsilon_j$ represent the virtual N phase digital signal with the zero bias drift removed; and the phase can be calculated according to $\phi(i,j)=\arctan [\tan(\pi/N)^*[\{C(i+1,j)+C(i,j)\}/\{(C(i+1,j)-C(i,j)\}]]$.

Linear interpolation can be used to align the N sets of samples to each other in the time domain.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings.

The main factors that present problems in phase measurement are deep amplitude modulation (up to 50%) and the large dynamic range (up to 40 dB) of the measured signal, as well as additive and multiplicative noises.

Frequency-dependent circuits, trigger-circuit phase detectors and other methods have been proposed for the detection of phase deviation. The method based on the processing of an analytic signal seems to be the most promising. It allows the efficient suppression of all kinds of additive noises whose frequencies differ from the carrier frequency $f_c$ by a value exceeding $f_{max}$ and, unlike conventional phase detector circuits, does not cause stepwise changes in the output signal at the moments when the phase crosses a value that is a multiple of $2\pi$.

Stepwise changes of the output signal at the limits of the linear range are the main disadvantage of a pulsed phase meter (for example, an AD9901 model). Moreover, near these points, some phase meters of this type have a zone of insensitivity to phase variations of the input signal.

Another disadvantage of pulsed phase meters is the abrupt increase of noise that occurs when the signal amplitude is lowered. This effect is caused by the non-linear transformation of an analog signal into a digital one. By lowering the signal amplitude, the error of determining the instant at which the signal passes through zero, i.e., the phase error, increases.

A noise-immune transformation of a real signal into a digital form with a minimal additive noise can be attained by using the analog-to-digital converter (ADC) on the sound card of a personal computer (PC) or a similar widely available circuit or device. This makes it possible to attain a high degree of accuracy and obtain sample values at equal time intervals, being able to use in already installed PC interface and to use the available signal processing software.

The proposed method is most efficient if the center frequency $f_1$ of the measured signal equals 1/3 (or, as discussed later, 1/N) of the ADC sampling frequency $f_s$:

$$f_1 \approx f_0, f_0 = f_s/3. \tag{1}$$

Figure 1:
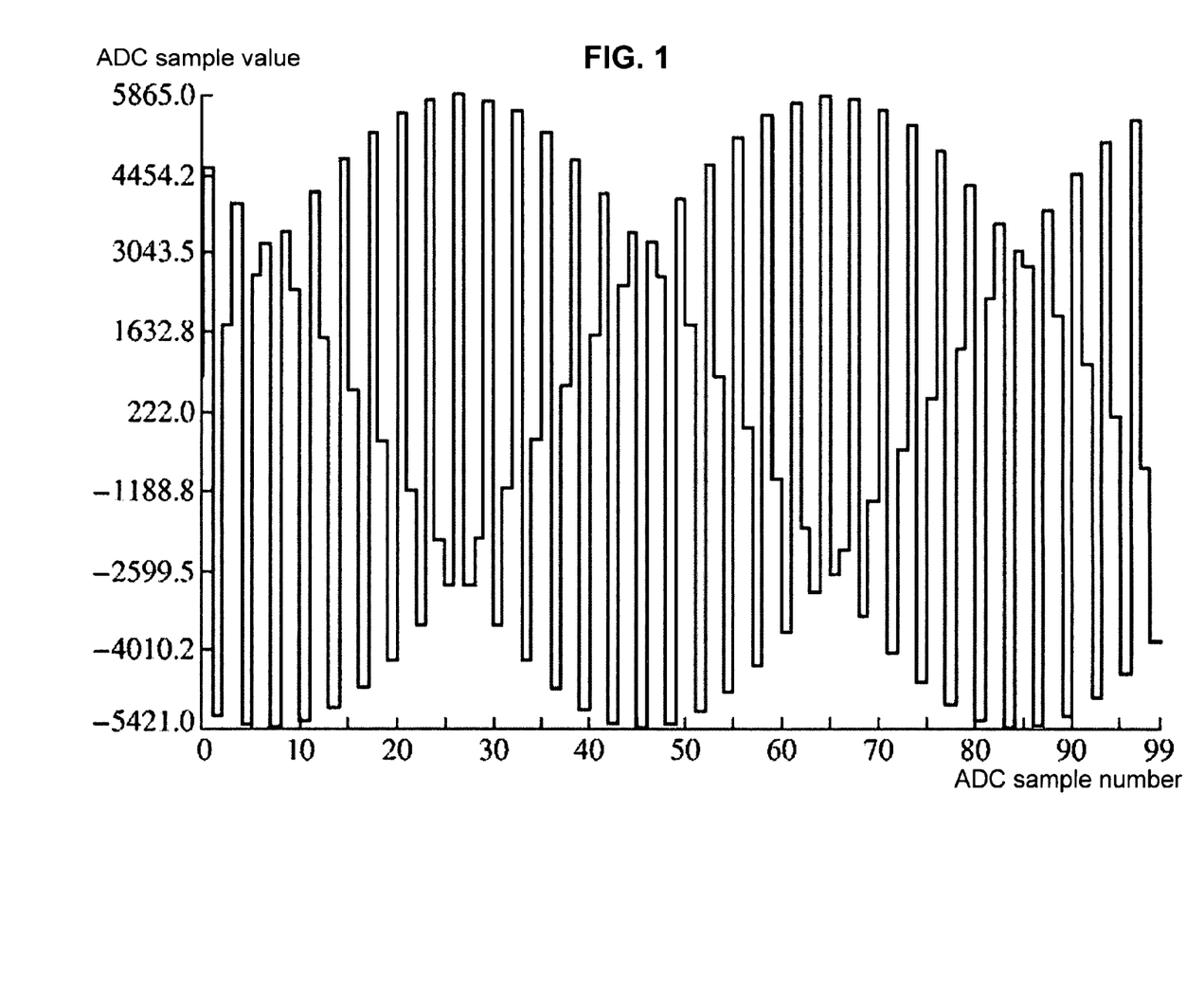
FIG. 1 shows a sample of the input signal in one channel.

For example, if $f_s$=48 kHz, the center frequency of the phase detector should be $f_0$=16 kHz. Condition (1) can be satisfied by transferring the spectrum of the initial high frequency signal to this carrier frequency f via the heterodyne frequency conversion method. FIG. 1 shows a sample of the input signal in one channel when condition (1) is satisfied. The stepwise approximation was chosen in order to demonstrate the stroboscopic effect observed when the frequency of the input signal is close to a subharmonic of the ADC sampling frequency $f_s$.

Figure 2:
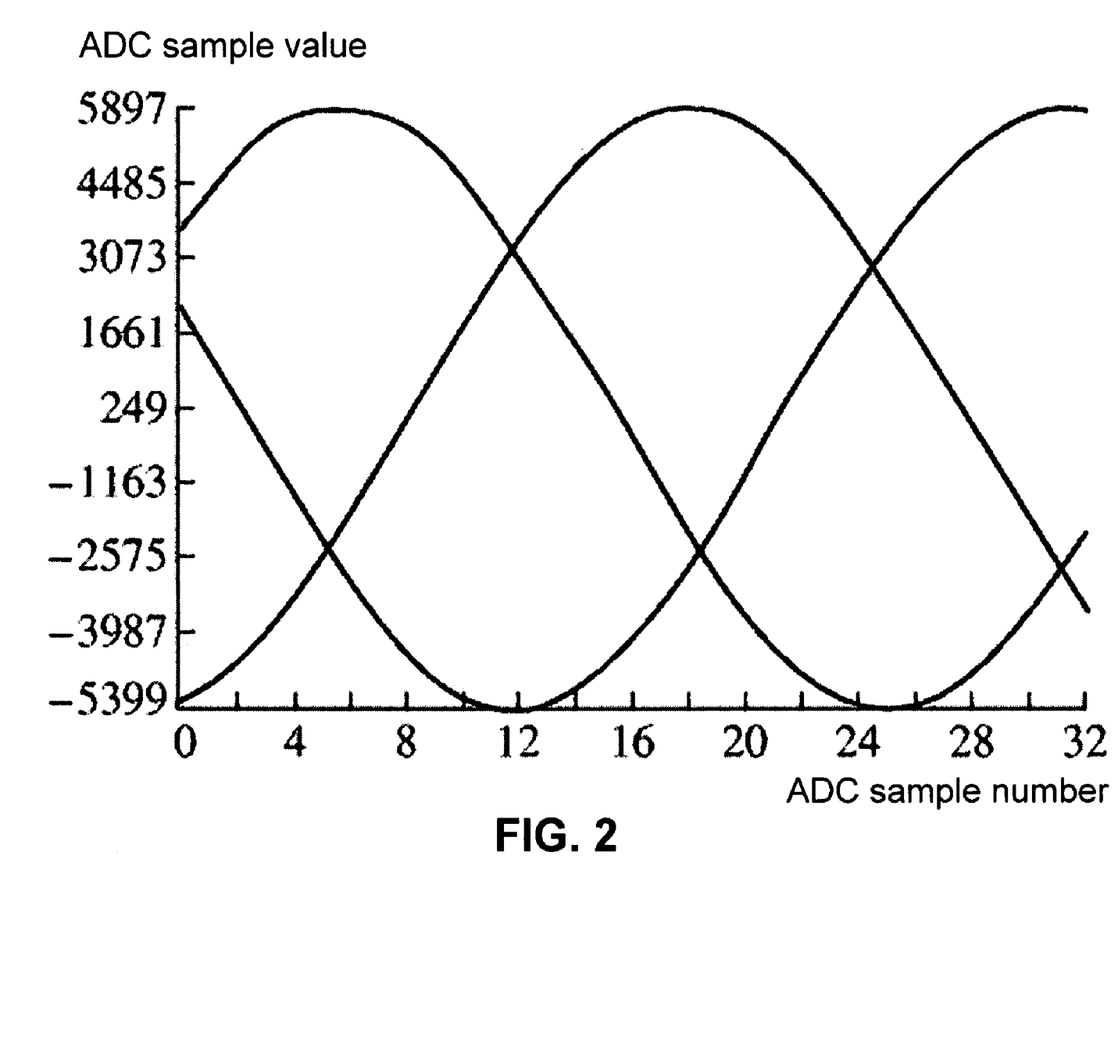
FIG. 2 shows samples containing every third sample value of the input signal.

FIG. 2 shows samples containing every third sample value of the input signal satisfying condition (1). These samples can be represented as samples of a three-phase signal with frequency $f_d=f_1-f_0$; the sampling frequency of each sample is $f_s/3$.

The three sets of samples obtained in this manner are treated below as projections of a vector (whose phase is to be measured) onto three axes oriented at angles of 120° with respect to each other. The vector rotates in this coordinate system with an angular velocity corresponding to difference frequency $f_d=f_1-f_0$. Using the three projections of this vector, the ADC zero bias can be calculated and eliminated and, afterwards, two projections of this vector onto the X and Y axes can be analytically obtained. These projections are used to determine the rotation angle of the vector, i.e., the parameter $\Delta\phi$.

The signals can then enter the input of the PC sound card, where the phase difference is calculated in real time and the results can be recorded in a file. After digital filtering, an analog signal proportional to the phase difference of the input signals in the frequency band 300–3000 Hz is formed at the linear output of the sound card.

Let us represent samples $U_j$ of the input signal in one channel as three sets of samples describing projections of some vector onto axes oriented at angles of 120° with respect to each other, $$A_j = U_{3j}, B_j = U_{3j+1}, C_j = U_{3j+2}, j \square [0, 1, 2, \ldots \infty] \tag{2}$$

These samples are shifted in time relative to one another by the ADC sampling period $T_s$. In order to reference these samples against some "universal" time, linear interpolation can be used.

If two adjacent sample values $A_j$ and $A_{j+1}$ are obtained at time instants $t_j$ and $t_{j+1}$, respectively, their linear combination $\alpha A_j + (1-\alpha)A_{j+1}$ can be treated as one sample obtained at the instant $$\alpha t_j + (1-\alpha)t_{j+1} \tag{3}$$

In equation 3, parameter $\alpha$ varies from zero to unity. Consider six successive sample values $A_j$, $B_j$, $C_j$, $A_{j+1}$, $B_{j+1}$, and $C_{j+1}$ taken at instants $t_j+iT_s$, where i=0, 1, 2, ..., 5; $T_s$ is the ADC sampling time; and $t_j=3jT_s$ is the time of sample value $A_j$.

$$A'_j = (A_j + 5A_{j+1})/6 \tag{4}$$

can be treated as the sample value obtained at instant $$t_j + 2.5T_s.$$

Similarly, $$B'_j = (B_j + B_{j+1})/2, \tag{5}$$

and $$C'_j = (5C_j + C_{j+1})/6 \tag{6}$$

are sample values obtained at the same time $t_j+2.5T_s$. Therefore, applying equations (4)–(6) to initial sample values (2), new samples whose values are referenced against the same time are formed.

A "perfect" three-phase signal satisfies the relationship $$U_A + U_B U_C = 0 \tag{7}$$

Therefore, the sum $\epsilon_j = (A'_j + B'_j + C'_j)/3$ determines the ADC zero bias drift. Subtracting $\epsilon_j$ from $A'_j$, $B'_j$, and $C'_j$, sample values $A''_j$, $B''_j$, and $C''_j$ are obtained, with ADC zero bias drift removed. These values are taken at the same instant $t_j+2.5T_s$ and satisfy the following equation (8) that is an analog of equation (7):

$$A''_j + B''_j + C''_j = 0 \tag{8}$$

If the original coordinate system is specified by vectors a, b, and c, oriented at an angle of 120° with respect to one another, then, in order to change to Cartesian coordinates specified by the orthonormalized vectors x and y, $$x = a, y = (b-c)/\sqrt{3}. \tag{9}$$

Hence, in Cartesian coordinates, the projections of the vector are $$X_j = A''_j, Y_j = (B''_j - C''_j)/\sqrt{3} \tag{10}$$

and the desired phase can be calculated from the relationship $$\varphi_{jA} = \arctan\frac{\sqrt{3}\,A''_j}{B_j - C_j} \qquad (11)$$

Expression (11) is asymmetric with respect to $A''_j$, $B''_j$ and $C''_j$. A symmetric expression can be derived if a cyclic permutation is used in order to obtain two additional phase estimates $\varphi_{jB}$ and $\varphi_{jC}$ and calculate the mean value of all three estimates:

$$\varphi_j = \frac{1}{3}(\varphi_{jA} + \varphi_{jB} + \varphi_{jC}) \qquad (12)$$

Averaging the three independent estimates, the signal-to-noise ratio is further increased.

As a result, the sample values of phase $\varphi_j$ at instants $(3j+2.5)T_s$ are obtained. If input signal sample $U_j$ begins with the second or third element of input array $U_0$ (rather than with the first element), then, performing these operations, sample values of the signal phase taken at instants $$(3j+1+2.5)T_s \text{ or } (3j+2+2.5)T_s,$$

grouping the values according to the sample time and taking into account the rotation of the sample vector through 120°, the sample values of the signal phase with ADC sampling frequency $f_s$ are obtained. Afterwards, a moving average filter for averaging the result over three adjacent sample values (one period) can be applied. This filter suppresses amplitude modulation and noises. Additionally, the digital filtering of sample values in vector projections $A''_j$, $B''_j$, and $C''_j$ can be performed. The phases of vectors corresponding to different channels are subtracted and digital filtering is applied to narrow the spectrum of the obtained signal to a band of e.g., 3 kHz.

Time-domain leveling and the elimination of the ADC zero bias drift allows to almost completely exclude the influence of the measured signal's amplitude modulation on the result of measurements. For example, a 10% modulation of a signal with a carrier frequency of 10.7 MHz by a sine wave with a frequency of 1 kHz causes a response at a level of $2\pi \times 10^{-5}$ rad; this is comparable to intrinsic noise.

The sensitivity of this method is limited by intrinsic noise at a level $S_1 = 2\pi \times 10^{-5}$ rad (0.0036°). Digital filtering can lower the noise level to $S_2 = 6\pi \times 10^{-6}$ rad (0.001°). In the time domain, this corresponds to a sensitivity of about $10^{-12}$ seconds in measuring time deviations of the signal front. A picosecond sensitivity is attained if the signal level is at least 1 mV.

The approach described above can be extended from N=3 to an arbitrary number N greater than three. As in the discussion above, where the input signal is divided into three sets of samples, the input signal can be divided into N sets of such samples. The sets of samples can be represented as set of samples of a single N-phase signal, with a sampling frequency $f_s = f_1 - f_0$, with a sampling frequency of $f_{s/N}$ for each of the sets. Where in the discussion above relating to N=3, the three-phase signal had three axes oriented at 120° to each other, with an arbitrary N, there are N axes, all oriented at an angle of 360/N° relative to each other.

The sets N samples can then be interpreted as projections of a vector, whose phase needs to be measured, onto axes that are oriented at an angle of 360/N° relative to each other. This vector rotates in a coordinate system with a rate of angular rotation equal to $f_S = f_1 - f_0$. To increase the accuracy of determination of the N projections of the vector, the zero bias drift of the ADC is calculated and removed, after which the projections of the vector onto the X and Y axes of the Cartesian coordinate system can be calculated. These projections can be used to determine the angle of rotation of the vector, which corresponds to the signal phase.

Extending the above discussion for a three-phase signal to the more general case of N phases, the input signal $U_j$ is represented by N samples, which describe a projection of the vector onto the axes oriented at the various angles 360°/N relative to each other:

$$A(1,j) = U_{Nj},\ A(2,j) = U_{Nj+1},\ A(3,j) = U_{Nj+2},\ \ldots\ A(N,j) = U_{Nj+N-1},\ j\in[0, 1, 2 \ldots \infty] \qquad (13)$$

On the time axis, the samples are shifted relative to each other by a time constant equal to the sampling period $T_s$ of the analog-to-digital converter. Linear interpolation can be used to transform the samples as follows:

Let $A(k,j)$ and $A(k,j+1)$, where $k\in[1 \ldots N]$ be the adjacent samples, taken at the time $t_j$ and $t_{j+1}$. Taking a linear combination $$\alpha A(k,j) + (1-\alpha)A(k,j+1),\text{ where } 0 \leq \alpha \leq 1 \qquad (14)$$

This combination can be viewed as a single sample, taken at the moment of time $$\alpha t_j + (1-\alpha)t_{j+1} \qquad (15)$$

Now, considering N subsequent samples:

$A(1,j)$, $A(2,j)$, $A(3,j)$, . . . , $A(N,j)$, $A(1,j+1)$, $A(2,j+1)$, $A(3,j+1)$, . . . , $A(N,j+1)$, taken at the moment in time $t_j = NjT_s$ where $T_s$ is the time between samples of the analog-to-digital converter and $t_j = N_j T_S$ is the time when the sample $A(1,j)$ was received.

Let $$B(1,j) = [A(1,j) + (2N-1)A(1,j+1)]/2N \qquad (16)$$

This equation represents the alignment in time of the samples that are separated from each other by N samples.

Then using Equations 14 and 15, $B(1,j)$ is the value received at the time $t_j + (2N-1)T_s/2$.

Analogously with the N=3 case, the more general case can be calculated as follows:

$$B(2, j) = [3A(2, j) + (2N-3)A(2, j+1)]/2N, \qquad (17)$$

$$B(3, j) = [5A(3, j) + (2N-5)A(3, j+1)]/2N,$$

$$\ldots$$

$$B(N, j) = [(2N-1)A(N, j) + A(N, j+1)]/2N,$$

These are all samples taken at the same time, $t_j + (2N-1)T_s/2$. Therefore, from Equation 13, and using equations 16 and 17, new sets of samples can be generated, with a single time frame. For example, in the case of N=3, the first set of samples can be shifted forward in time by $1/f_s$, the second set can remain unchanged, and the third set can be shifted back in time by $1/f_s$, so that all the sets are aligned to the second set. Any number of other ways of aligning the sets of samples in time can be used.

As discussed above with the N=3 case, and generalizing to the general case for an arbitrary N, the ideal N-phase signal has the following relationship $$U_1 + U_2 + \ldots + U_N = 0 \qquad (18)$$

The error, represented by $\epsilon_j=[B(1,j)+B(2,j)+ \ldots +B(N,j)]/N$ is not equal to zero, and represents the zero bias drift of the analog-to-digital converter. In order to compensate for the zero bias drift, the error $\epsilon_j$ needs to be subtracted from the sets of values $B(1,j)$, $B(2,j)$, ... $B(N,j)$, which already represent values aligned to a single time frame. In order to compensate for the zero bias drift, the error $\epsilon_j$ can be subtracted from the sets of values $B(1,j)$, $B(2,j)$, ... $B(N,j)$ which are already adjusted in time. Thus, a set of values $C(1,j)$, $C(2,j)$, ... $C(N,j)$ is generated, where $$C(1, j) = B(1, j) - \epsilon_j, \quad (19)$$
$$C(2, j) = B(2, j) - \epsilon_j,$$
$$\ldots$$
$$C(N, j) = B(N, j) - \epsilon_j$$

which represents compensation of the zero bias drift. For the case of arbitrary N, the set of values $C(1,j)$, $C(2,j)$, ... $C(N,j)$ must follow the following relationship (analogous to Equation 18):

$$C(1,j)+C(2,j)+ \ldots +C(N,j)=0 \quad (20)$$

Therefore, it can be concluded that the set of values $C(1,j)$, $C(2,j)$, ... $C(N,j)$ is the set of values with the zero bias drift of the analog-to-digital converter compensated for and taken at the same moment in time $t_j+(2N-1) T_s/2$.

Figure 3:
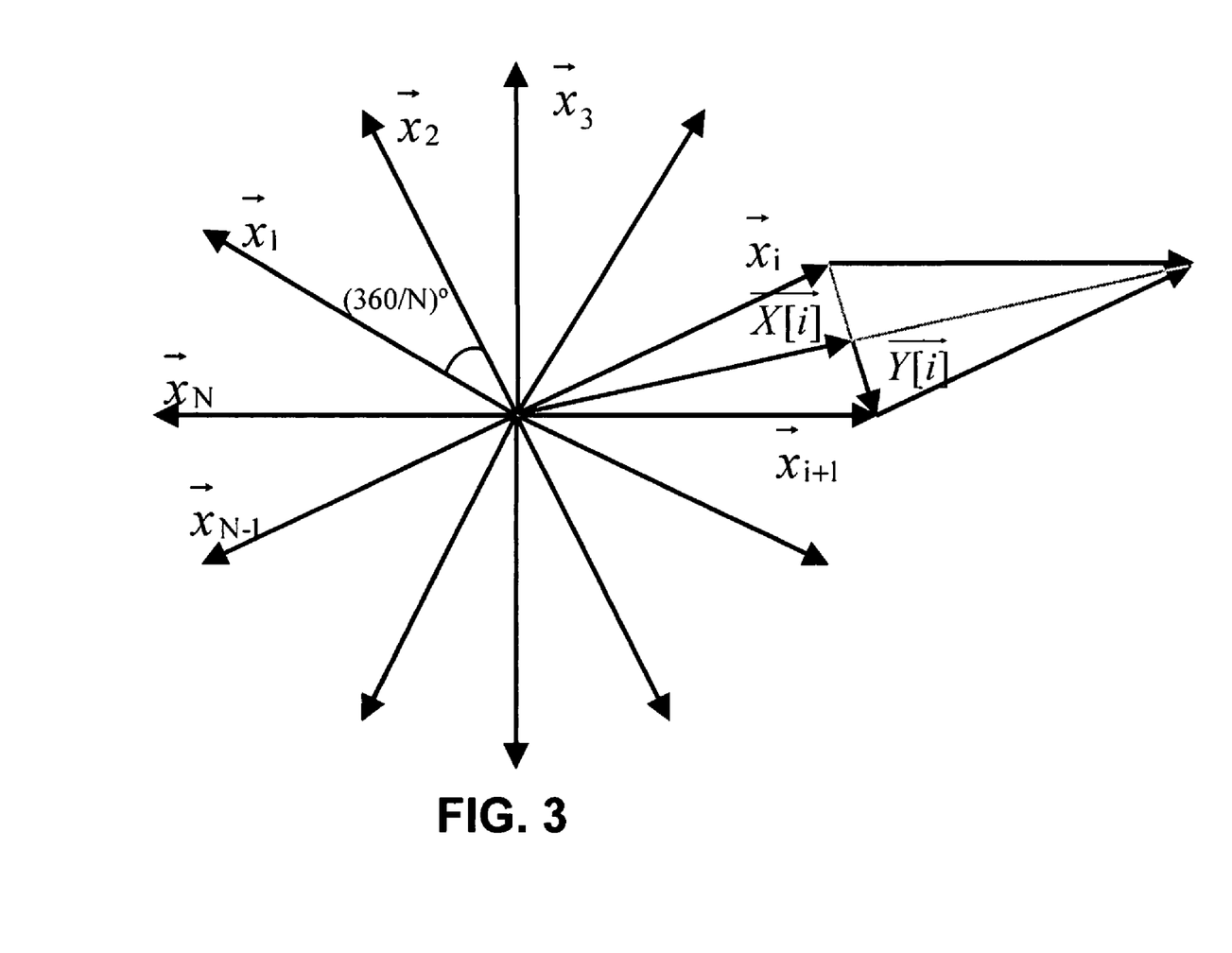
FIG. 3 shows a initial coordinate system representing the signals as vectors.

To simplify calculation of phase, a Cartesian coordinate system can be used. The initial coordinate system described above contain a set of N vectors $\vec{x}_1, \vec{x}_2, \ldots, \vec{x}_N$, with the angle between adjacent vectors of the coordinate system equal to $360/N°$, similar to what is shown in FIG. 3. Taking any two adjacent vectors ($\vec{x}_i, \vec{x}_{i+1}$) where $i \in [1, 2 \ldots N]$, and transforming these vectors into a Cartesian coordinate system $(\overrightarrow{X[i]}, \overrightarrow{Y[i]})$, the following relationships hold $$\overrightarrow{X[i]} = \frac{1}{2\cos\left(\frac{\pi}{N}\right)}(\vec{x}_{i+1} + \vec{x}_i) \quad (21)$$

$$\overrightarrow{Y[i]} = \frac{1}{2\sin\left(\frac{\pi}{N}\right)}(\vec{x}_{i+1} + \vec{x}_i)$$

The vector projections in this coordinate system are equal to:

$$D(X[i],j)=[C(i+1,j)+C(i,j)]/2 \cos(\pi/N)$$
$$D(Y[i],j)=[C(i+1,j)-C(i,j)]/2 \sin(\pi/N) \quad (22)$$

From Equation 22, the phase of a signal, which is the quantity being sought, can be calculated as follows:

$$\phi(i,j)=\arctan [\tan(\pi/N)*[\{C(i+1,j)+C(i,j)\}/\{(C(i+1,j)-C(i,j)\}]] \quad (23)$$

Therefore, by using different pairs of adjacent vectors as the initial coordinate system, N independent and equally weighted estimates of the phase $\phi(1,j)$, $\phi(2,j)$, ... $\phi(N,j)$ can be calculated.

In order to improve the signal to noise ratio, N independent estimates of the phase can be averaged, to receive a more accurate estimate of the phase:

$$\phi_j=[\phi(1,j)+\phi(2,j)+ \ldots +\phi(N,j)]/N \quad (24)$$

Having calculated the phase $\phi_j$, the phase values at the moment in time $(2N-1+2Nj)T_s/2$ are now known. If the samples of the input signal $U_j$ are taken not with the first element's $U_0$, but with the second element's use of one, third sample's use of two ... or the Nth sample's $U_{N-1}$, then, repeating the steps described above, the phase calculation at the moment in time $(2N+1+2Nj)T_s/2$, $(2N+3+2Nj)T_s/2$, ... $(4N-3+2Nj)T_s/2$ can be calculated. Grouping these values by the time in which the samples are received, and taking into consideration the angle of rotation $360/N°$, the value of the phase can be calculated with a frequency about equal to the sampling frequency $f_s$ of the analog-to-digital converter.

Figure 4:
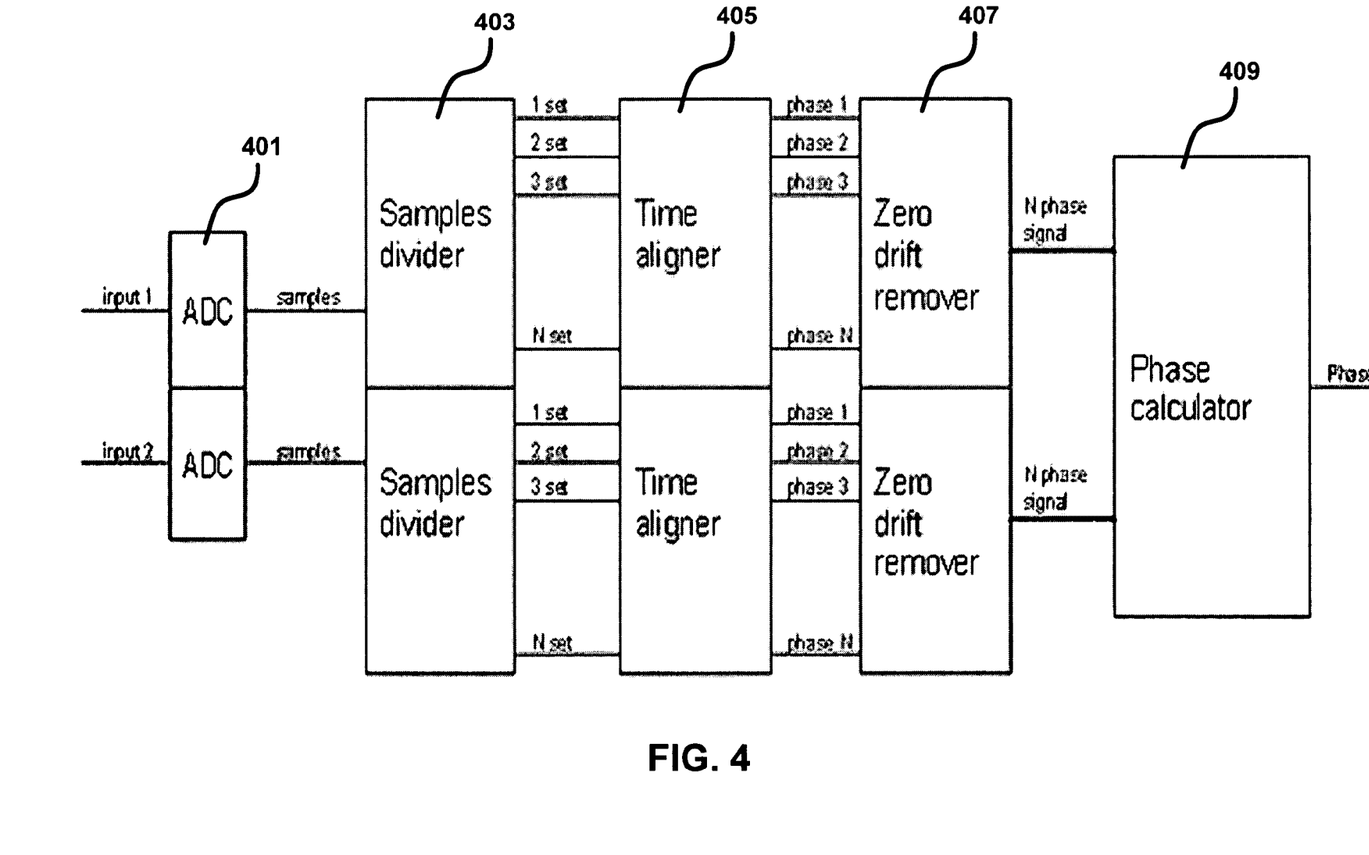
FIG. 4 illustrates in block diagram form one embodiment of the invention.

FIG. 4 illustrates an exemplary circuit that may be used to implement the invention. It will be understood that FIG. 4 is a block diagram, and the invention can be implemented in any number of configurations. For example, the circuit can use stand alone analog-to-digital converters, a PC soundcard, stand alone digital signal processing chips, etc. Alternatively, all the circuitry can be incorporated into a single integrated circuit, for example, an ASIC, etc.

Turning again to FIG. 4, shown in FIG. 4 in block diagram is a dual-channel analog-to-digital converter 401, which receives two input signals, input 1 and input 2. It should be noted that phase is normally measured relative to something, for example, the phase of one signal can be measured relative to another signal, such as shown in FIG. 4. Alternatively, the phase of a single signal can be measured relative to some reference, for example, relative to the clock signal of the analog-to-digital converter.

Further with reference to FIG. 4, the dual-channel analog-to-digital converter 401 samples the input signals input 1 and input 2, and outputs two sets of samples to a sample divider circuit 403. The sample divider circuit 403 converts the two sample streams from the ADC 401 into a first group of samples (1st set–Nth set of samples in the upper portion) and a second set of samples (also 1st set–Nth set of samples in the lower portion) as discussed above.

These two groups of samples are then fed into a time aligner 405, which aligns both groups of sets of samples to a common time frame. Note that the time frame can be common for all the groups, or can be separate for the first group and for the second group (in other words, for the first input signal and the second input signal). The time aligner 405 outputs a set of signals that represents phase to a zero bias drift remover 407, as shown in FIG. 4. The operation of the zero bias drift remover 407 is as described above. The zero bias drift remover 407 outputs two N phase signals to a phase calculator 409, which also works according to the equations described above. The phase calculator 409 then outputs the phase, which is the sought quantity. As noted earlier, the phase can be a phase of the two signals relative to each other, or the phase of single signal relative to some other reference signal, such as the clock signal of the circuit.

At this point, the concept of phase dynamic range is worth addressing. The first aspect of phase dynamic range is phase resolution. If two inputs are connected to each other and to a signal generator, their difference phase will be zero. If the intrinsic noise level is measured, a typical value will be around $2\pi 10^{-4}$ radians. The approach described above permits reducing the intrinsic noise down to $2\pi 10^{-5}$ radians, which is an order of magnitude better.

A second aspect is phase range limitation, which is typically on the order of $2\pi$. The dynamic range is therefore given by $20*\log_{10}$(phase range/intrinsic noise)

If the phase range is $2\pi$, and the intrinsic noise is $2\pi 10^{-5}$ radians, then the dynamic range is given by $20*\log_{10}(2\pi/(2\pi 10^{-5}))=20*\log_{10}(10^5)=20*5=100$ dB.

However, the proposed method (and device) has no phase range limitation, therefore, the dynamic range in phase is essentially infinite.

Another aspect is the scale factor. Typically, a phase meter has an analog output, which is usually specified, e.g., as 1 volt output corresponds to π radians. This value is called the scale factor, and has units of volts/radian. Conventional phase meters have a problem with scale factor stability. However, the proposed device and method calculates the phase directly, with no issues in scale factor stability.

Having thus described embodiments of the invention, it should be apparent to those skilled in the art that certain advantages of the described method and apparatus have been achieved. It should also be appreciated that various modifications, adaptations, and alternative embodiments thereof may be made within the scope and spirit of the present invention. The invention is further defined by the following claims.

What is claimed is:

1. A method of measuring phase comprising:
receiving an analog signal;
converting the analog signal into a digital signal;
representing the digital signal as N interleaved sets of samples wherein each set of samples is represented by a projection of a vector onto its corresponding axis;
aligning each of the N interleaved sets of samples to a common time frame;
removing zero bias drift from the digital signal; and
calculating a phase of the analog signal based on the digital signal with the zero bias drift removed based on the projections of the vectors.

2. The method of claim 1, wherein the phase has a time resolution substantially equal to a time between adjacent samples.

3. The method of claim 1, wherein:
axes oriented at the angles 360°/N relative to each other, with $A(1,j)=U_{Nj}, A(2,j)=U_{Nj+1}, A(3,j)=U_{Nj+2}, \ldots A(N,j)=U_{Nj+N-1}, j\epsilon[0, 1, 2 \ldots \infty]$, U being the analog signal;

$B(1, j)$ is a value received at the time $t_j + (2N - 1)T_s/2$, $B(2, j) = [3A(2, j) + (2N - 3)A(2, j + 1)]/2N$, $B(3, j) = [5A(3, j) + (2N - 5)A(3, j + 1)]/2N$,

...

$B(N, j) = [(2N - 1)A(N, j) + A(N, j + 1)]/2N$, $\epsilon_j=[B(1,j)+B(2,j)+ \ldots +B(N,j)]/N$ is the zero bias drift;

$C(1, j) = B(1, j) - \varepsilon_j$, $C(2, j) = B(2, j) - \varepsilon_j$,

...

$C(N, j) = B(N, j) - \varepsilon_j$ represent the digital signal with the zero bias drift removed; and
the phase is calculated according to $\phi(i,j)$=arc tan $[\tan(\pi/N)*[\{C(i+1,j)+C(i,j)\}/\{(C(i+1,j)-C(i,j)\}]]$.

4. The method of claim 1, further comprising using linear interpolation to align the N sets of samples to each other.

5. The method of claim 1, wherein each set of samples is represented by a projection of a vector onto axes oriented at 360°/N relative to each other, and wherein the zero bias drift is removed based on the vector projections.

6. An apparatus for measuring phase comprising:
an analog-to-digital converter that converts an analog signal into a digital signal;
a first circuit that represents the digital signal as N sets of interleaved samples and aligns the N sets of samples to a common time, wherein each set of samples is represented by a projection of a vector onto axes oriented at 360°/N relative to each other;
a second circuit that removes zero bias drift from the digital signal based on the vector projections; and
a third circuit that calculates phase of the analog signal based on the digital signal with the zero bias drift removed.

7. The apparatus of claim 6, wherein:

$A(1,j)=U_{Nj}, A(2,j)=U_{Nj+1}, A(3,j)=U_{Nj+2}, \ldots A(N,j)=U_{Nj+N-1}, j\epsilon[0, 1, 2 \ldots \infty]$, U being the analog signal;

$B(1, j)$ is a value received at the time $t_j + (2N - 1)T_s/2$, $B(2, j) = [3A(2, j) + (2N - 3)A(2, j + 1)]/2N$, $B(3, j) = [5A(3, j) + (2N - 5)A(3, j + 1)]/2N$,

...

$B(N, j) = [(2N - 1)A(N, j) + A(N, j + 1)]/2N$, $\epsilon_j=[B(1,j)+B(2,j)+ \ldots +B(N,j)]/N$ is the zero bias drift;

$C(1, j) = B(1, j) - \varepsilon_j$, $C(2, j) = B(2, j) - \varepsilon_j$,

...

$C(N, j) = B(N, j) - \varepsilon_j$ represent the digital signal with the zero bias drift removed; and
the phase is calculated according to $\phi(i,j)$=arc tan $[\tan(\pi/N)*[\{C(i+1,j)+C(i,j)\}/\{(C(i+1,j)-C(i,j)\}]]$.

8. The apparatus of claim 6, wherein the first, second and third circuits are combined as a digital signal processing circuit.

9. The apparatus of claim 6, wherein the first circuit uses linear interpolation to align the N sets of samples to each other.

10. The apparatus of claim 6, wherein the phase has a time resolution substantially equal to a time between adjacent samples.

11. The apparatus of claim 6, wherein the phase is stably measured ranging over multiples of π.

12. The apparatus of claim 6, wherein the phase is stably measured in an input signal with 40 dB amplitude dynamic range and over 50% modulation.

13. The apparatus of claim 6, wherein the phase is stably measured in an input signal with phase resolution of about $2\pi \cdot 10^{-5}$ radian.

14. The apparatus of claim 6, wherein the phase is stably measured without a phase range limitation.

15. The apparatus of claim 6, wherein the digital signal is represented as N interleaved sets of samples.

16. An apparatus for measuring phase comprising:
   a dual-channel analog-to-digital converter that converts a first analog signal and a second analog signal into a first digital signal and a second digital signal, respectively;
   a sample divider that represents the first and second digital signals as a first N sets of samples and a second N sets of samples, wherein the first N sets of samples are interleaved relative to each other, and the second N sets of samples are interleaved relative to each other and wherein each set of samples is represented by a projection of a vector onto its corresponding axis;
   a time aligner that aligns the first N sets of samples to a first common time and aligns the second N sets of samples to a second common time;
   a zero bias drift remover that removes zero bias drift from the first and second digital signals based on the projections of the vectors; and
   a phase calculator that calculates phase of the first and second analog signals relative to each other based on the first and second digital signals with the zero bias drift removed.

17. The apparatus of claim 16, wherein the sample divider, the time aligner and the zero bias drift remover are combined as a digital signal processing circuit.

18. The apparatus of claim 16, wherein the time aligner uses linear interpolation to align the first and second N sets of samples.

19. The apparatus of claim 16, wherein the phase has a time resolution substantially equal to a time between adjacent samples.

20. The apparatus of claim 16, wherein the phase is stably measured ranging over multiples of $\pi$.

21. The apparatus of claim 16, wherein the phase is stably measured in an input signal with 40 dB amplitude dynamic range and over 50% modulation.

22. The apparatus of claim 16, wherein the phase is stably measured in an input signal with phase resolution of about $2\pi \cdot 10^{-5}$ radian.

23. The apparatus of claim 16, wherein the phase is stably measured without a phase range limitation.

24. The apparatus of claim 16, wherein each set of samples is represented by a projection of a vector onto axes oriented at 360°/N relative to each other, and wherein the zero bias drift is removed based on the vector projections.

* * * * *